USOO5748008A

United States Patent [19]
Landreth

[11] Patent Number: 5,748,008
[45] Date of Patent: May 5, 1998

[54] ELECTRICAL INTEGRITY TEST SYSTEM FOR BOATS

[76] Inventor: Keith W. Landreth, 5701 Hadrian Dr., Durham, N.C. 27703

[21] Appl. No.: 568,186

[22] Filed: Dec. 6, 1995

[51] Int. Cl.$^6$ .................................................. G01R 31/02
[52] U.S. Cl. .................................................. 324/763
[58] Field of Search .......................... 324/500, 503, 324/555, 556, 537, 763, 765, 766, 767

[56] References Cited

U.S. PATENT DOCUMENTS

| | | | |
|---|---|---|---|
| 4,757,463 | 7/1988 | Ballou et al. | 73/117.2 |
| 5,177,447 | 1/1993 | Marino et al. | 324/713 |

OTHER PUBLICATIONS

Paper entitled "Testing Galvanic Isolators", unknown but believed to have been published sometime in 1986.
Article entitled "AC Shore Power, An Invitation To Electrocution?", *Practical Sailor*, Aug. 15, 1995 edition.
Article entitled "AC Systems: Safety vs. Corrosion", *Ocean Navigation Magazine*, Aug./Sep., 1994.
Article entitled "Galvanic Isolators", *Practical Sailor*, Jan. 15, 1996.

Letter from CEO of Professional Marine Inc. to Editor, *Professional Boat Builder Magazine*, dated Feb. 12, 1993.

*Primary Examiner*—Robert Raevis
*Attorney, Agent, or Firm*—Olive & Olive, P.A.

[57] ABSTRACT

An electrical integrity test system for boats provides circuitry for evaluating the integrity of the boat's electrical distribution AC grounding system when the boat is connected to a dock's electrical distribution system, and the integrity of the boat's galvanic isolator. The electrical integrity test system also includes a polarity detecting circuit that will activate an alarm when it detects a dock's hot and neutral conductors to be reversed. Additionally, the electrical integrity test system includes an AC ground current detecting circuit that continuously monitors the boat's AC grounding conductor for the presence of AC current. A system controller controls selected functions and sequence of functions of the described circuits. If the test system detects the AC grounding system or the boat's galvanic isolator is faulty or the dock's hot and neutral conductors are reversed or AC current flowing in the boat's AC grounding conductor, it will activate an alarm to apprise the boat operator of the faulty condition.

24 Claims, 5 Drawing Sheets

ELECTRICAL INTEGRITY TEST SYSTEM FOR BOATS

FIELD OF THE INVENTION

The invention relates to circuitry that evaluates and monitors electrical systems, in particular the integrity of a boat's AC grounding system and galvanic isolator.

BACKGROUND OF THE INVENTION

When boats or marine craft are docked and are connected to the dock's AC electric distribution system typically comprised of hot, neutral and grounding conductors, a number of potential dangers exist. Although a boat may be correctly wired, an inadequate or disconnected grounding conductor on the boat, or reversed polarity of the dock's AC electrical distribution system, poses a danger to electrical components on the boat. A more serious danger is that of electric shock of individuals in the boat, or possibly causing death by drowning of individuals in the water. The electric shock hazard exits as a result of inadequate AC grounding systems causing normal stray AC leakage and possible fault currents to flow through exposed metal boat components and through the water or through individuals in contact with an adequate ground.

While four wire systems are known, the typical dock AC electrical distribution supply comprises three wires, specifically referred to as the hot, grounding, and neutral conductors which are connected in turn to the boat's hot, grounding, and neutral conductor's respectively through the boat's power inlet. A three wire type supply and boat system is thus used as a basis for this description.

A boat typically includes AC powered appliances including battery chargers, refrigerators, air conditioners, and the like. A boat battery supplies DC power to DC powered devices such as engine starting motors, navigation equipment, running lights, and the like. A boat's AC and DC powered devices are bonded at a common point at the boat's DC ground, which is normally the boat's engine. For the purposes of this description, a boat's grounding system is referred to as the AC grounding system.

All AC leakage and fault current (hereinafter sometimes collectively referred to as fault current) is directed to the boat's DC ground. Since the boat's AC grounding circuit is bonded to the boat's DC ground, the fault current returns to the dock's electrical distribution system via the boat's grounding conductor and is directed to and cleared by the dock's circuit breaker. However, stray low level AC leakage currents that do not typically trip the circuit breaker are common. In many cases, stray currents flow because of faulty or aging appliances on the boat. A boat that is incorrectly wired or has damaged wiring poses the same dangers as an incorrectly wired dock electrical distribution system. If there is AC fault current and there is also an inadequate ground path back to the source of AC supply via the grounding conductor, the stray or fault AC current may flow through the water to the grounding system of a correctly wired adjacent boat, and then to the dock's electrical distribution system.

Boats connected to the dock's electrical distribution system share that system's common earth ground. This common ground acts to electrically connect the boats together. When two or more of these boats are connected via a dock's electrical system, a galvanic cell can be established between different underwater metal parts of these boats. Galvanic action results and what is referred to as DC galvanic current flows through the water between adjacent boats and through the commonly shared AC grounding conductor. This galvanic action can corrode a boat's underwater metal parts, and possibly sink a boat. The degree of corrosion is dependent on a number of parameters, such as the salinity of the water, electric current density, surface area and nature of the underwater metals, etc.

The two most common devices currently available to protect against galvanic corrosion are the isolation transformer and the galvanic isolator. An isolation transformer transmits power from the dock's distribution system to the boat by means of magnetic inductive coupling through a transformer. Therefore, the isolation transformer opens the electrical circuit between the boat, the dock, and other boats electrically connected to the dock. Isolation transformers are expensive, large, and heavy, and are therefore not widely used in the boat industry.

The second and more common device used to block galvanic current is the galvanic isolator. The galvanic isolator is serially installed in the boat's AC grounding conductor, usually immediately adjacent or within close proximity to the boat's power inlet. The galvanic isolator is typically comprised of two sets of opposing pairs of silicon diodes and an optional capacitor in parallel with the two diode sets, and which are enclosed in a metal or plastic housing. The threshold voltage at which diodes are biased varies among diodes. Typically all silicon diodes start conducting current at a voltage level as low as 0.4 to 0.45 volts and are assumed to be in full conduction at approximately 0.6 volts to 0.8 volts. Therefore, the diode pairs of a galvanic isolator start conducting at 0.9 to 0.95 volts and are fully biased at 1.20 to 1.6 volts.

The primary purpose of the galvanic isolator is to block all DC galvanic currents in both directions, but provide a path for AC leakage or fault currents back to the dock's power system earth ground. The sets of diodes, and the capacitor, if one is provided, are electrically insulated from the boat. However, one side of the galvanic isolator is connected to the boat's negative engine terminal, or DC ground, which electrically bonds the negative side of the boat's DC system and the AC grounding system together, and its other side is connected by the boat's AC grounding conductor to the AC grounding pin on the boat's power inlet.

Galvanic isolators are relatively inexpensive, compact, and light. However, the integrity of galvanic isolators can be compromised in a number of ways. For example, a faulty open diode or open capacitor of a galvanic isolator would normally prevent or block DC galvanic currents from flowing, but may not pass AC leakage or fault currents back to the dock electrical system. These currents may nevertheless find an alternative path to ground, possibly through the boat's out-drive, through the water and adjacent boats to the dock's earth ground, thus endangering persons in the water and on other boats.

Even if a galvanic isolator is initially operable, limited fault currents may not immediately trip the dock's circuit breaker, but may create high temperatures within the galvanic isolator and pose a fire hazard. The high temperature may cause the galvanic isolator diode(s) to short (or open). A shorted diode compromises the ability of the galvanic isolator to effectively block DC galvanic currents.

Typically, the integrity of a galvanic isolator is not checked until a boat sinks or is significantly damaged by corrosion, or until fire, drowning, or electrocution results. Since galvanic isolators are installed in the AC grounding conductor and used in the boating industry to block DC galvanic current, the integrity of the boat's AC grounding conductor should never be compromised.

Therefore, there is a need in the boat industry for an apparatus that determines if a boat's galvanic isolator is operational, and generates a signal if it is not. There is also a need for an apparatus that detects and monitors dock and boat electrical distribution and AC grounding systems, and signals when a fault is detected in one of these systems.

SUMMARY OF THE INVENTION

Circuitry is provided to evaluate the polarity of the dock's electrical distribution system, the integrity of a boat's electrical distribution AC grounding system when the boat is connected to a dock's electrical distribution system, and the integrity of the boat's galvanic isolator. The present invention includes a galvanic isolator integrity-detecting circuit, a polarity-detecting circuit, an AC ground current detecting circuit, and a momentary AC inducing circuit. A system controller controls selected functions of the described circuits. The boat's galvanic isolator integrity detecting circuit tests the ability of the boat's galvanic isolator to conduct AC currents and simultaneously block low voltage DC galvanic currents. If the ability of the galvanic isolator to accomplish these tasks is compromised, the system controller will activate an alarm. The circuitry will detect connections which allow DC current to by-pass the galvanic isolator, defeating its ability to block galvanic currents. The invention circuitry will also evaluate the condition of the AC grounding conductor to pass AC current and the system controller will activate the alarm in the event it is inadequate.

A polarity-detecting circuit is connected between the boat's neutral and grounding conductors. The circuit will detect if the polarity of the hot and neutral conductor's of the dock's electrical system are reversed and the system controller will activate the alarm in the event the polarity of the two conductors are reversed.

An AC ground current-detecting circuit continually monitors and detects AC current passing through the boat's grounding conductor back to ground on shore. If the AC current exceeds a pre-determined level for a certain length of time, the current-detecting circuit will provide a signal to the system controller which will activate the alarm.

A momentary AC current-inducing circuit induces AC current into the boat's grounding system. The AC ground current detecting circuit detects whether the induced AC current passes from the boat's AC grounding conductor to the dock's electrical distribution to earth ground. If the boat's or dock's grounding conductor is opened or is otherwise inadequate for this task, the system controller will activate an alarm to alert the operator.

The above and still further objects, features and advantages of the present invention will become more apparent upon consideration of the following detailed description of an illustrative embodiment thereof, taken in conjunction with the accompanying drawings.

DETAILED DESCRIPTION OF THE INVENTION

Figure 1:
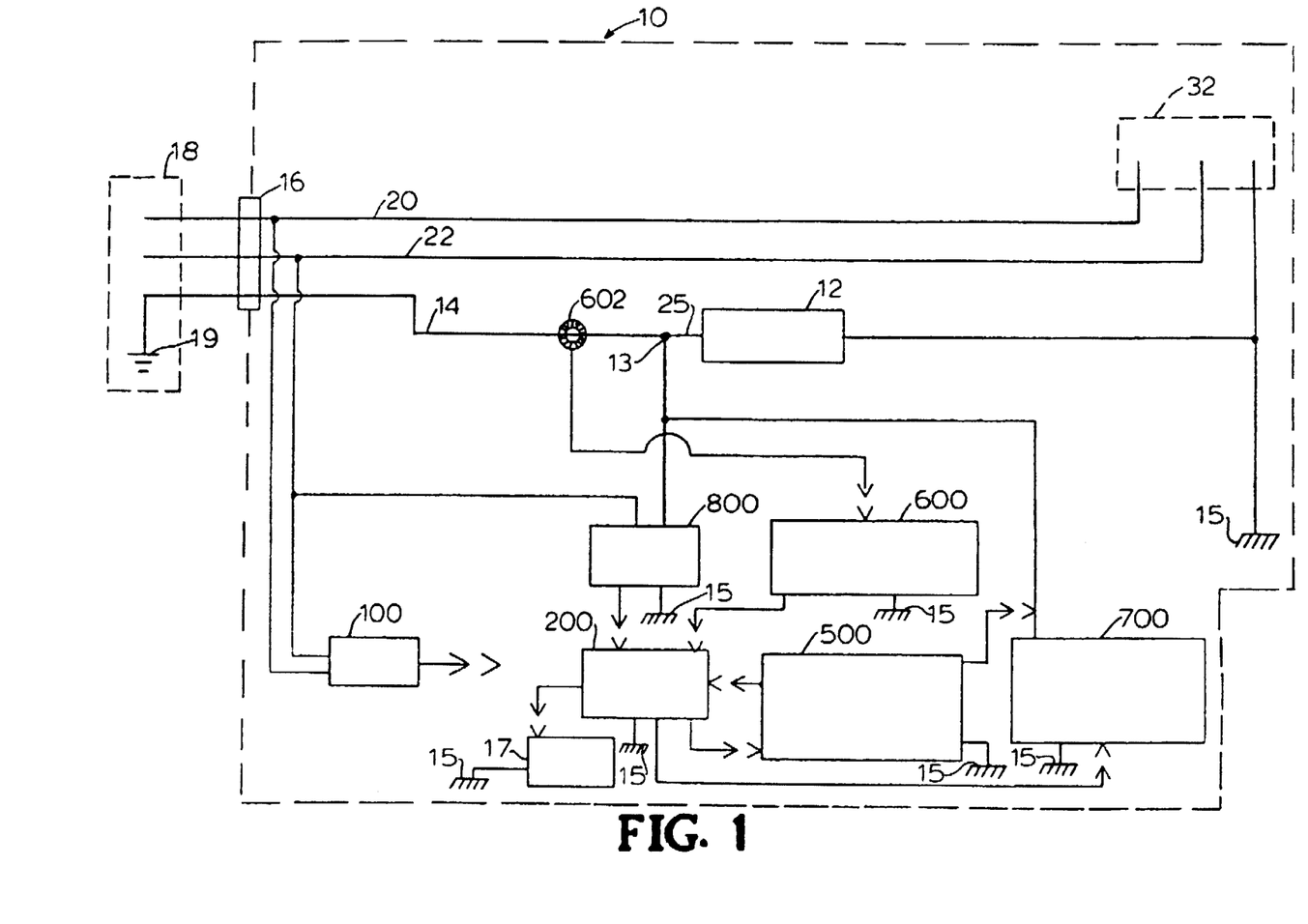
FIG. 1 is a schematic diagram of the Electrical Integrity Test System For Boats shown connected to a boat's electrical system in an illustrative embodiment of the present invention.
Figure 2:
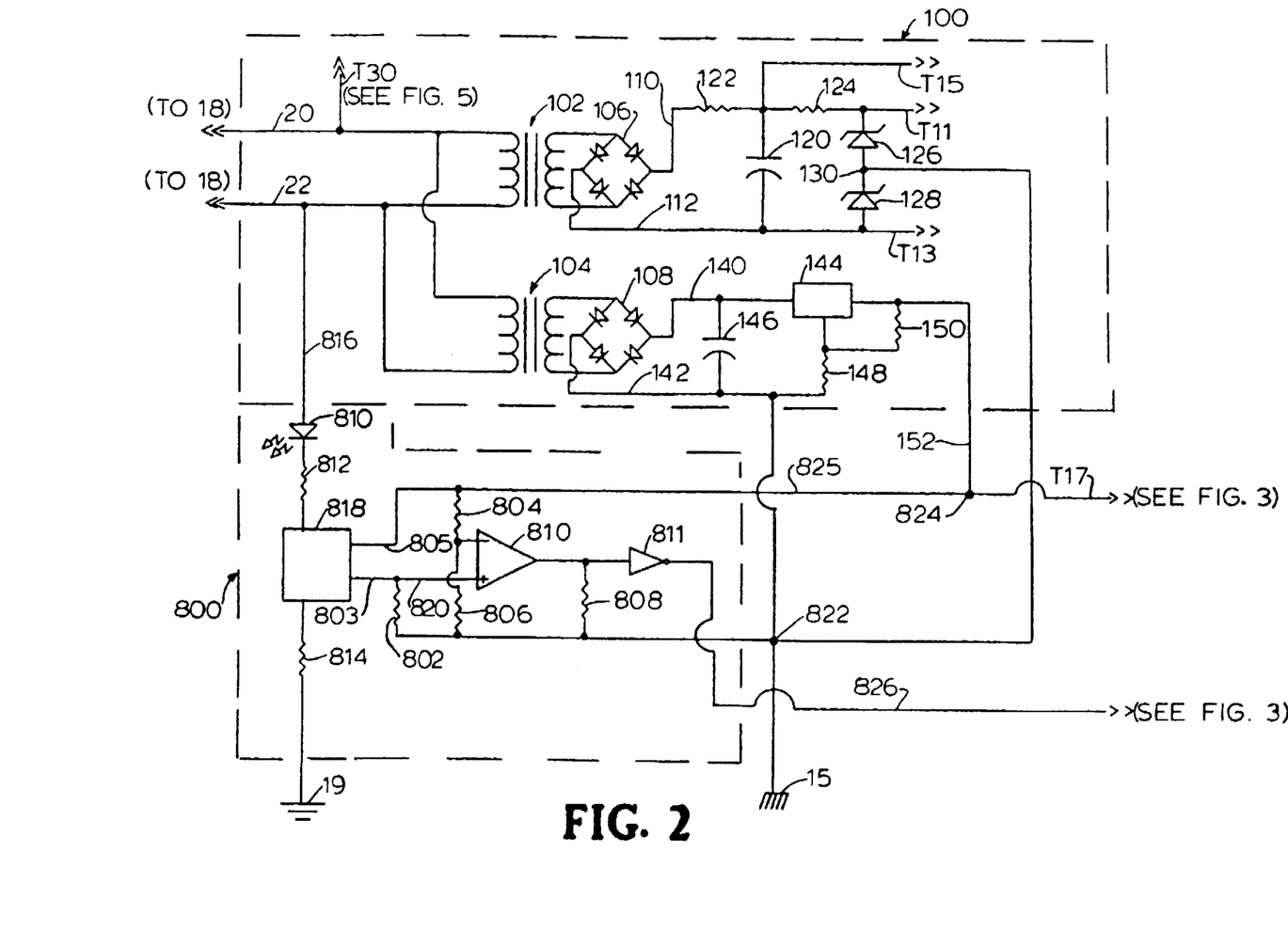
FIG. 2 is a detailed schematic diagram of the power supply circuit and polarity detecting circuit of the embodiment illustrated in FIG. 1.

FIG. 1 is a schematic diagram of an illustrative embodiment of the electrical integrity test system 10 of the invention as applied to boats. Test system 10 comprises a galvanic isolator 12 connected in series with the boat's AC grounding conductor 14 between boat DC ground 15 and the ground pin to the boat's electrically insulated power inlet 16. Galvanic isolator detecting-circuit 500 is shown connected to the boat's AC grounding conductor 14 at junction 13 located between galvanic isolator 12 and earth ground 19 by means of the boat's electrically insulated power inlet 16 and is referenced to boat DC ground 15. Galvanic isolator detecting circuit 500 is further connected to system controller 200. FIG. 1 shows the circuitry components of the electrical integrity test system 10 referenced to boat DC ground 15. FIG. 1 further illustrates a power supply 100 connected to hot and neutral conductors 20, 22 which connect to the dock's electrical distribution system 18 by means of the boat's electrically insulated power inlet 16 and further connected to the remaining circuitry components of the present invention for supplying DC power thereto. Hot and neutral conductors 20, 22 further extend to the boat's AC distribution panel 32 through which AC appliances on the boat are connected. The AC distribution panel 32 is grounded to the boat's DC ground 15. It is understood that electrical integrity test system 10 of the invention may be operated by any DC power source, including a boat battery. A polarity detecting circuit 800 is interconnected between neutral conductor 22 and earth ground 19 through ground conductor 14 at junction 13 and to system controller 200. An AC ground current-detecting circuit 600 is connected (physically, but not electrically) to grounding conductor 14 by way of current transformer 602 and to system controller 200. The momentary AC current inducing circuit 700 is connected to grounding conductor 14 at junction 13 momentarily so as to induce AC current therein, and is further connected to system controller 200. An alarm 17 is connected to system controller 200. A power supply circuit 100 provides DC power to the above described circuits. The circuit components illustrated in FIG. 1 are described separately and in more detail below. Reference is next made to FIG. 2 which is a detailed schematic diagram of the power supply and polarity detecting circuits referred to above.

Referring to FIG. 2, power supply circuit 100 converts AC power supplied by the dock's electrical distribution system 18 (FIG. 1) to DC power for use by the circuitry of the invention. Power supply circuit 100 is comprised of a pair of step-down isolator transformers 102, 104, each transformer 102, 104 being connected to the dock's AC electrical distribution system 18 by hot and neutral conductors 20, 22, respectively. Transformers 102, 104 are connected to bridge rectifiers 106, 108 respectively.

Bridge rectifier 106 has output lines 110, 112. Capacitor 120, zener diodes 126, 128 and resistors 122, 124 are connected downstream of bridge rectifier 106 as illustrated in FIG. 2. Boat DC ground 15 is connected to junction 130 such that power supply circuit 100 applies a positive 6V and a negative 6V at dual polarity split-rail voltage terminals T11, T13 respectively. Power supply circuit 100 applies DC voltage to terminal T15, which is connected to line 110 between resistors 122, 124.

Bridge rectifier 108 has output lines 140, 142 connected to voltage regulator 144. Capacitor 146, resistors 148 and 150 are connected downstream of bridge rectifier 108 as illustrated in FIG. 2. Voltage regulator 144 is connected to voltage terminal T17 by line 152.

The polarity detecting circuit 800 illustrated in FIG. 2 receives DC power from the voltage regulator 144 by line 825 through junction 824. Resistors 802, 806, 808 are connected to boat DC ground 15. Resistor 804 is connected to the inverting input terminal of op-amp 810 as shown. Polarity detecting circuit 800 further includes optocoupler 818, resistors 812, 814 and LED 810 along line 816 and located between the boat's neutral conductor 22 and earth ground 19 by means of grounding conductor 14. Resistors 812 and 814 have a minimum total series resistance of 25,000 ohms.

Figure 3:
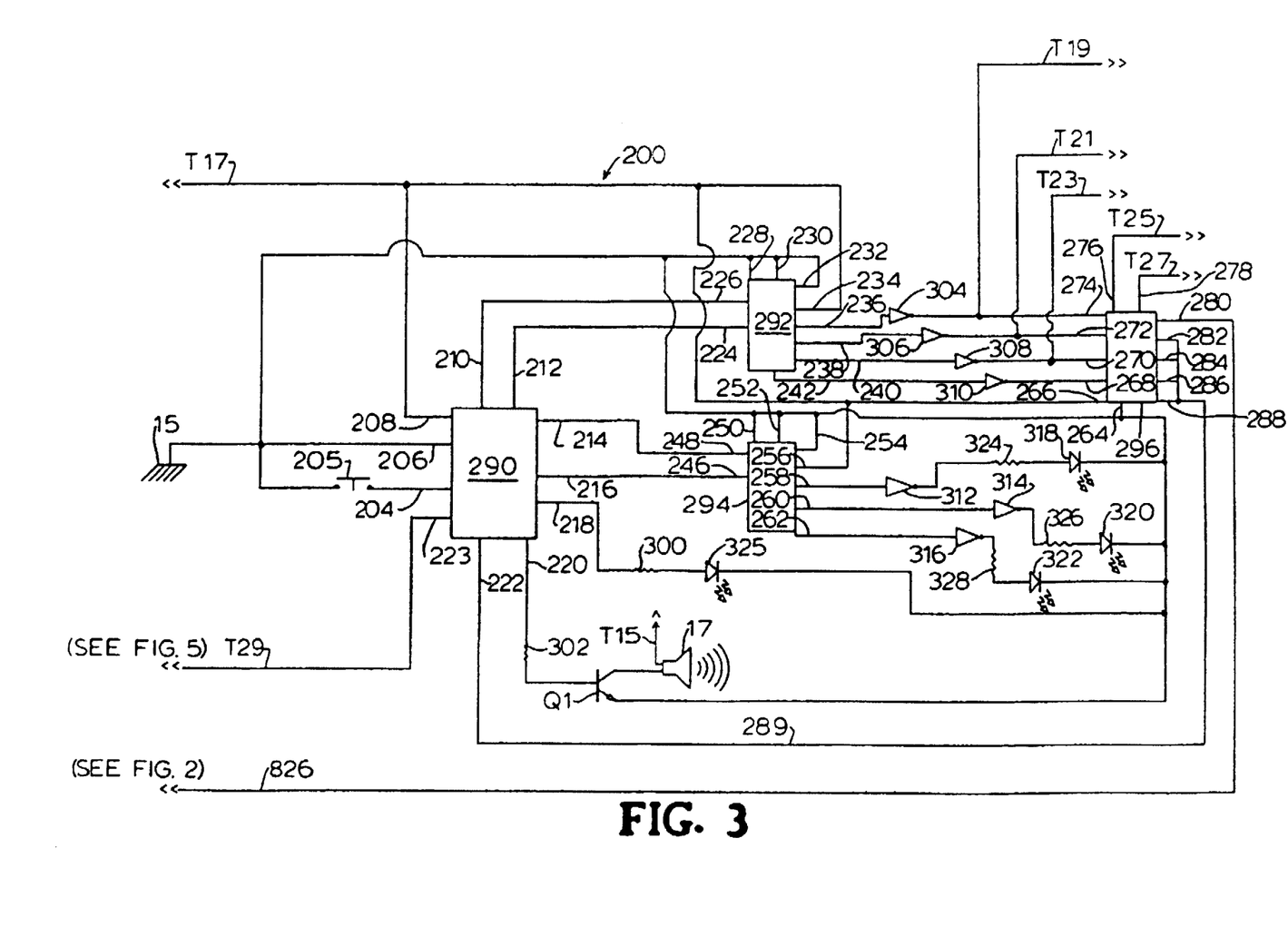
FIG. 3 is a detailed schematic diagram of the system controller circuit of the embodiment illustrated in FIG. 1.

Pin 803 is the emitter terminal and pin 805 is the collector terminal of optocoupler 818. Pin 803 is connected to the non-inverting terminal of op-amp 810 by line 820. Pin 803 is further connected to the resistor 802. Collector terminal 805 of optocoupler 818 is connected through junction 824 by line 825 to pins 234, 256 of decoders 292, 294 respectively, to pin 266 of quad analog switch 296, and to pin 208 of controller 290 of system controller circuit 200 (FIG. 3). Further connected to boat DC ground 15 are pins 228, 230, 232 of decoders 292 and pins 250, 252, 254 of decoder 294, as well as pin 264 of switch 296 and controller 290 respectively.

Resistors 804 and 806 comprise a voltage divider and are connected to the inverting terminal of op-amp 810. Op-amp 810 is connected to inverter 811. Inverter 811 output is connected to pin 280 of switch 296 by line 826. Resistor 808 is referenced to boat DC ground 15 and is connected to the output of op-amp 810 and provides a reference to ground for inverter 811.

FIG. 3 shows a system controller circuit 200 that controls selected functions of the described circuits, and comprises a controller 290. Controller 290 output pins 210, 212 are connected to pins 226, 224 of decoder 292, with output pins 214, 216 connected to pins 248, 246 of decoder 294, and with pins 220, 218 as output pins to transmit signals to the base terminal of transistor Q1 through resistor 302 and to the anode terminal of light emitting diode (LED) 325 through resistor 300 respectively. The cathode terminal of LED 325 is connected to ground pin 264 of switch 296. The collector terminal of transistor Q1 is connected to alarm 17. The emitter terminal of transistor Q1 is connected to ground pin 264 of switch 296. Input pin 222 of controller 290 is connected to pins 282, 284, 286, and 288 of switch 296 by line 289. Input pin 223 is connected to inverter 604 by terminal T29 (refer to FIG. 5). Pin 208 of controller 290 is connected to the output of voltage regulator 144 by line 152 through terminal T17 and to the collector terminal of optocoupler 818. Pin 204 of controller 290 is connected to a normally open momentary reset switch 205. The other side of reset switch 205 is connected to boat DC ground 15.

System controller circuit 200 decodes signals generated by controller 290 and provides outputs for given input signals. System controller circuit 200 components not already described above are output pins 236, 238, 240 and 242 of decoder 292, which are connected to the input side of inverters 304, 306, 308, 310. Inverters 304, 306, 308, 310 are connected to pins 274, 272, 270, and 268 of switch 296 respectively. Terminals T25 and T27 are connected to pins 276 and 278. Terminals T19, T21, and T23 are connected to pins 274, 272, 270 of switch 296 respectively. Output pins 258, 260, 262 of decoder 294 are connected to inverters 312, 314, 316, which inverters are then connected to LEDs 318, 320, 322 respectively. Current limiting resistors 324, 326, 328 and LEDs 318, 320, 322 are placed downstream of inverters 312, 314, 316 as shown in FIG. 3.

Figure 4:
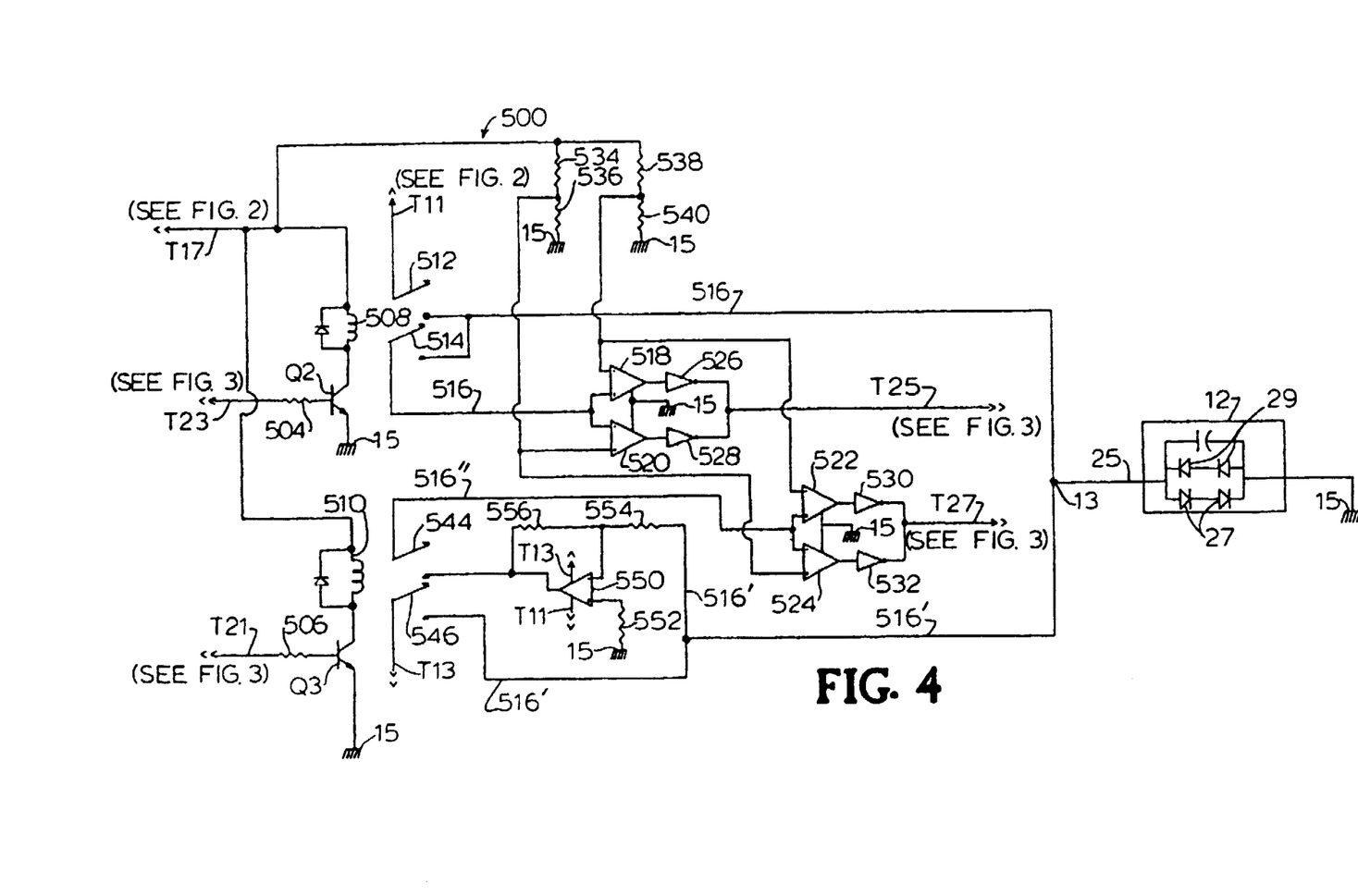
FIG. 4 is a detailed schematic diagram of the galvanic isolator integrity detecting circuit of the embodiment illustrated in FIG. 1.

Next described is galvanic isolator integrity detecting circuit 500 as illustrated in FIG. 4. Galvanic isolator circuit 500 comprises two transistors Q2, Q3 with base terminals connected to terminals T23, and T21 through resistors 504, 506, respectively. The emitter terminal of transistors Q2, Q3 are each connected to boat DC ground 15. The collector terminals of transistors Q2, Q3 are connected to relays 508, 510 respectively.

Normally open contacts 512, 514 of galvanic isolator integrity detecting circuit 500 are operable by relay 508 and when closed connect line 516 to terminal T11. Line 516 connects terminal T11 and comparators 518, 520 to a terminal side 25 of galvanic isolator 12 through junction 13. Resistors 534, 536, comprise a voltage divider which is connected to non-inverting inputs of comparators 520, 524 respectively. Resistors 538, 540 comprise a voltage divider which is connected to inverting inputs of comparators 518, 522 respectively. Voltage is applied across resistors 534, 536, 538, and 540 by terminal T17. Inverters 526, 528, are connected to the output of comparator 518, 520 respectively and to terminal T25. Inverters 530, 532 are connected to the output of comparators 522, 524 respectively and to terminal T27.

Normally open contacts 544, 546 of galvanic isolator integrity detecting circuit 500 are operable by relay 510 and when in a closed position connects line 516' to terminal T13. Lines 516' and 516" connect terminal T13 and comparators 522, 524 through op-amps 550 to terminal side 25 of galvanic isolator 12 through 516'. Resistors 552, 554, 556 along with op-amp 550 comprise a unity gain inverting amplifier.

Figure 5:
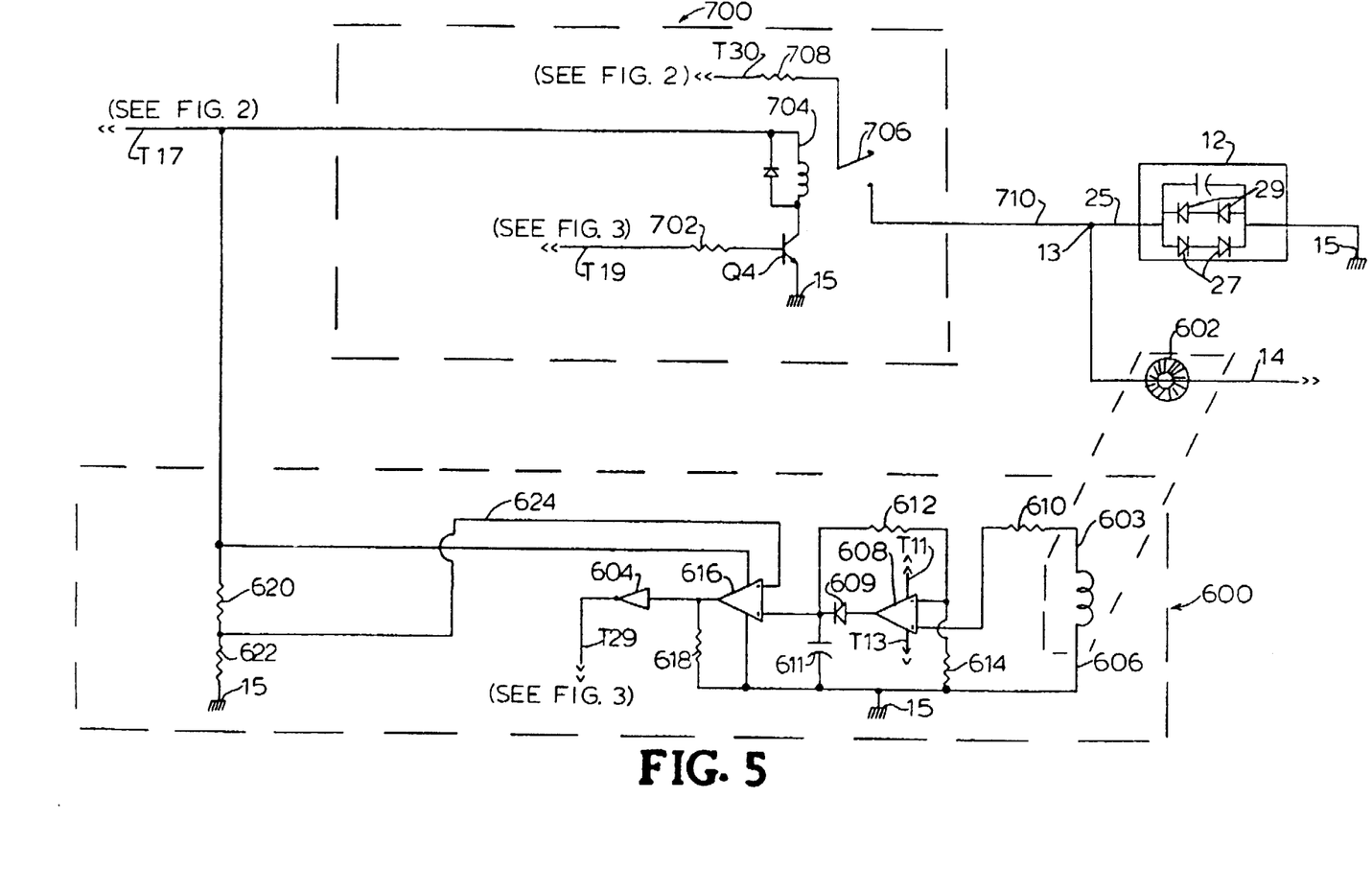
FIG. 5 is a detailed schematic diagram of the momentary AC current inducing circuit and the AC ground current detecting circuit as in the embodiment illustrated in FIG. 1.

Referring to FIG. 5, AC ground current detecting circuit 600 comprises a coil of a current transformer 602 positioned around (physically, but not electrically connected to) grounding conductor 14. Current transformer 602 also comprises first terminal 603 and a second terminal 606 connected to boat DC ground 15. Line 603 is connected to the non-inverting terminal of op-amp 608 through resistor 610. Resistors 610, 612, 614 along with diode 609, op-amp 608, and capacitor 611 comprise a peak detecting circuit which provides input to op-amp 616. Inverter 604 is connected to pin 223 of controller 290 through terminal T29 (see FIG. 3). Resistor 618 comprises a reference to ground for inverter 604. Resistors 620, and 622 comprise a voltage divider connected to the inverting terminal of op-amp 616 along line 624.

Referring to FIG. 5, the momentary AC current inducing circuit 700 is comprised of transistor Q4 having its base terminal connected through resistor 702 to terminal T19 (see FIG. 3). The transistor Q4 emitter is connected to boat DC ground 15, and its collector is connected to relay 704 having a single normally open contact 706. When contact 706 is closed an AC voltage is dropped across resistor 708 supplying an AC current through line 710 into the boat's grounding system.

The function of each circuit is described separately as follows. The system controller circuit 200 of FIGS. 1 and 3 includes controller 290 programmed with pins 210, 212, 214, 216, 218 and 220 as output pins providing control signals and pins 222 and 223 as input pins for receiving status signals from the external circuits. The purpose of decoders 292 and 294 is to decode the signal generated by controller 290 and provide an output that corresponds for a given input signal received from controller 290. Pins 226, 224, and 248, 246 are the input control pins of decoders 292, 294 respectively. Pins 236, 238, 240, and 242 of decoder 292 and pins 258, 260 and 262 of decoder 294 are output pins. The binary state of the output pins of decoders 292 and 294 depend on the signal received by the input control pins 226, 224, and 248, 246 of decoders 292, 294 respectively. For example, if a bit pattern of "00" is received by pins 226 and 224 of decoder 292 then the output bit pattern on pins 236, 238, 240, 242 will be "0111". For a bit pattern of "11" on pins 226, 224 the output bit pattern on pins 236, 238, 240, 242 will be "1110".

Switch 296 is used as a data selector. For a given input on the control pins 274, 272, 270, 268 of switch 296, switch 296 selects data on one of three input pins 280, 276, or 278 and transfers it to the output pins 282, 284, 286 or 288, which are tied together. In this way, switch 296 selects which pins 280, 276, or 278 it will connect to the output pins 282, 284, 286, 288, for a given bit pattern on pins 274, 272, 270, 268. For example, if the bit pattern "0010" were received by pins 274, 272, 270 and 268 of switch 296, then the input data on pin 276 of switch 296 would be transferred to the output pins 282, 284, 286, 288 of switch 296. In summary, the purpose of switch 296 is to select the status signal that is to be checked by controller 290.

Controller 290 is programmed to conduct the following steps. When shore power is connected to the boat, controller 290 initializes its input and output pins. Controller 290 initially sets pins 210, 212, 214, 216 as high or "1" output states and pins 220 and 218 as low or "0" output states. Pins 222 and 223 are initially set as blow or "0" input states.

Controller 290 first checks the polarity of the dock's hot and neutral conductors 20, 22. The polarity detecting circuit 800 provides a status signal that is transmitted from the output of inverter 811 by line 826 to pin 280 of switch 296. The initial setting of pins 210 and 212 of controller 290 as high or "1" output bits is transmitted to the input-pins 226 and 224 of decoder 292. A bit pattern of "11" on pins 226, 224 of 292 will produce an output bit pattern of "1110" on pins 236, 238, 240, 242 of decoder 292. The output of pins 236–242 of decoder 292 are inverted by inverters 304, 306, 308, 310 respectively and transmitted to the control pins 274, 272, 270, 268 of switch 296. For the inverted bit pattern received by switch 296 on pins 274, 272, 270, 268 the input data on pin 280 is transferred to the output pins 282, 284, 286, 288 and is transmitted by line 289 to pin 222 of controller 290. Controller 290 checks the status signal on pin 222 to determine if the polarity of conductors 20 and 22 is reversed. If the status signal on pin 222 of controller 290 is low indicating the polarity of conductors 20 and 22 is reversed, then controller 290 sets pin 220 high biasing transistor Q1 through resistor 302 and activating alarm 17.

If the status signal transmitted to pin 222 of controller 290 is high, indicating that the polarity of the hot and neutral conductors 20, 22 is not reversed, system controller circuit 200 will proceed to check the integrity of the galvanic isolator 12 by setting pins 210 and 212 of controller 290 high and low. This "10" bit pattern is transmitted to pins 226, 224 of decoder 292 setting the output states of pins 236, 238, 240, 242 of decoder 292 as a "1101" bit pattern. The output of pins 236–242 of decoder 292 are inverted by inverters 304, 306, 308, 310 transmitting a "0010" bit pattern, pin 270 high, to the control pins 274, 272, 270, 268 of switch 296.

In addition to pin 270 of switch 296 being high, terminal T23 to transistor Q2 (FIG. 4) is energized biasing transistor Q2 causing contacts 512, 514 to close. Through closed contact 512, terminal T11 energizes line 516 to drop voltage, across galvanic isolator 12, with respect to the boat DC ground 15, biasing first diode pair 27 of galvanic isolator 12. Closed pole 514 connects the comparators 518, 520 to galvanic isolator 12 at terminal 25 through line 516. Reference voltages established by resistors 534, 536, 538 and 540 provide a "voltage window" at comparators 518 and 520. The voltage window comprises minimum and maximum voltage references. Comparators 518 and 520 compare the voltage drop across diode pair 27 of the galvanic isolator 12 to the voltage window. If the voltage drop across diode pair 27 is outside the boundaries established by the voltage window, either comparator 518 or 520 will have a high output. If the voltage drop is within the voltage window, both outputs of the comparators 518 and 520 will be low. The outputs of comparators 518, 520 are connected to inverters 526, 528. If the voltage drop is within the voltage window, the connected output of the inverters 526, 528 will be high. If the voltage drop is outside of the voltage window the connected output of the inverters 526, 528 will be low.

The output status signal of the inverters 526, 528 is transmitted by line T25 to pin 276 of switch 296, then to output pins 282, 284, 286, 288 of switch 296 and transmitted by line 289 to pin 222 of controller 290 (FIG. 3). Controller 290 checks the status signal on pin 222 to determine whether the voltage drop across the diode pair 27 of the galvanic isolator 12 is outside the voltage window. If the status signal transmitted to pin 222 of controller 290 is low, indicating that the voltage drop across the diode pair 27 is outside the voltage window, controller 290 sets its pins 210, 212 high, removing the biasing from transistor Q2 opening contacts 512, 514, and thereby setting pins 214, 216, 220 of controller 290 high. Setting pins 214, 216 of controller 290 high transmits a "11" bit pattern to pins 248, 246 of decoder 294 which sets the output states of pins 258, 260, 262 of decoder 294 as a "110" bit pattern. The output of pins 258–262 of decoder 294 are inverted by inverters 312, 314, 316 to a "001" bit pattern energizing LED 322. Setting pin 220 of controller 290 high biases transistor Q1 activating alarm 17.

Referring to FIGS. 3 and 4, if the status signal transmitted to pin 222 of controller 290 is high, corresponding to operative diode pair 27, system controller 290 will momentarily set pins 210, 212 both high removing biasing from Q2. Therefore opening contacts 512 and 514 then sets pins 210, 212 low and high. This "01" bit pattern is transmitted to pins 226, 224 of decoder 292 setting the output states of decoder 292 pins 236, 238, 240, 242 as a "1011" bit pattern. The output of pins 236–242 of decoder 292 are inverted by inverters 304, 306, 308, 310 transmitting a "0100" bit pattern, pin 272 high, to the control pins 274, 272, 270, 268 of switch 296. In addition to pin 272 of switch 296 being high, terminal T21 to transistor Q3 (FIG. 4) is energized biasing transistor Q3 causing contacts 544, 546 to close. Through pole 546 terminal T13 energizes line 516' to drop a negative voltage across galvanic isolator 12, with respect to boat DC ground 15, biasing diode pair 29 of galvanic isolator 12. Closed pole 544 connects comparators 522, 524 through the unity gain inverting amplifier to terminal 25 of galvanic isolator 12 through line 516' and 516". Reference voltages established by resistors 534, 536, 538, 540 provide a "voltage window" at comparators 522 and 524. Comparators 522 and 524 compare the voltage drop across the diode pair 29 of the galvanic isolator 12 to the voltage window established at comparators 522, 524. If the voltage drop is outside the boundaries established by the voltage window, either comparator 522 or 524 will have a high output. If the voltage drop is within the voltage window, both outputs of the comparators 522, 524 will be low. If the voltage drop is within the voltage window, the connected outputs of the inverters 530, 532 will be high. If the voltage drop is outside of the voltage window, the connected output of the inverters 530, 532 will be low.

The output status signal of the connected inverters 530, 532 is transmitted by terminal T27 to pin 278 of switch 296, which is connected to the output pins 282–288 of switch 296 and transmitted by line 289 to pin 222 of controller 290. Controller 290 checks the status signal transmitted to pin 222 to determine if the diode pair 29 of the galvanic isolator 12 is operational. If the status signal transmitted to pin 222 is low, indicating that diode pair 29 is not operational, controller 290 sets pins 210, 212 high, thereby removing the biasing from transistor Q3 opening contacts 544, 546, and sets pins 214, 216, 220 of controller 290 high. Setting pins 214, 216 of controller 290 high will transmit a "11" bit pattern to pins 248, 246 of decoder 294 setting the output states of pins 258, 260, 262 as a "110" bit pattern. The output of pins 258–262 of decoder 294 are inverted by inverters 312, 314, 316 transmitting a "001" bit pattern and energizing LED 322. Setting pin 220 of controller 290 high biases transistor Q1 and activates alarm 17.

If the status signal transmitted to pin 222 of controller 290 is high a third consecutive time, indicating correct polarity of AC power and that diode pairs 27, 29 are operational, then controller 290 momentarily sets pins 210, 212 both high removing the biasing from Q3, therefore opening contacts 544 and 546 and then sets pins 210, 212 low. This "00" bit pattern is transmitted to pins 226, 224 of decoder 292 setting the output states of pins 236–242 as a "0111" bit pattern. The output of pins 236–242 of decoder 292 are inverted by inverters 304–310 transmitting a "1000" bit pattern, pin 274 high, to the control pins 274–268 of switch 296 respectively. In addition to pin 274 of 296 being high, terminal T19 to transistor Q4 through resistor 702 is energized biasing transistor Q4 of the momentary AC current inducing circuit 700 causing contact 706 to close (see FIG. 5).

Referring to FIG. 5, closing contact 706 induces an AC current along line 710 into the boat's AC grounding system through junction 13. The level of the AC current is determined by resistor 708. The grounding conductor 14 passes through the center of the current transformer 602, physically but not electrically connecting them. If an adequate electrical path exists back to the dock's electrical distribution system 18 via the AC grounding conductor 14, then the AC current will pass through the boat's AC grounding conductor 14. When AC current passes through grounding conductor 14, an AC voltage is magnetically induced across the coil of current transformer 602, thereby transmitting a voltage to the non-inverting terminal of op-amp 608 of the AC ground current detecting circuit 600. Op-amp 608 serves as an amplifier and peak detecting circuit and produces a signal gain output determined by the resistors 610, 612, 614. Op-amp 608 amplified signal is transmitted to diode 609. Diode 609 rectifies op-amp 608 amplified signal charging capacitor 611 to this amplified voltage level. Op-amp 616 serves as a voltage comparator comparing the peak voltage charge of capacitor 611 to a voltage reference. The reference voltage is determined by resistors 620, 622. When capacitor 611 reaches a voltage level that exceeds the reference voltage at the inverting terminal of op-amp 616, due to AC current passing through the AC grounding conductor 14, then the output of op-amp 616 switches from a low to high state thereby providing a high state to the input of inverter 604. Inverter 604 would thus provide a low output state. Resistor 618 serves to provide a reference to ground or a "0" state for inverter 604 when the output of op-amp 616 is low, and when the output of inverter 604 is high. A low output state for inverter 604 would indicate AC current is detected passing through the AC grounding conductor 14. The output of inverter 604 serves as a status signal and is transmitted by terminal T29 to pin 223 of controller 290.

When transistor Q4 is biased and contact 706 closed, controller 290 checks the status signal transmitted from the output of inverter 604 to pin 223. If an adequate electrical connection exist and AC current returns back to the dock's electrical distribution system 18 via the boat's AC grounding conductor 14, the output of op-amp 604 will be low. If the status signal at pin 223 of controller 290 is high, indicating AC current is returning to ground by other means, controller 290 set pins 210, 212, 220, 218 high. Setting pins 210, 212 high opens contacts 706 disconnecting the induced AC current. Setting pins 220, 218 high biases transistor Q1 activating alarm 17 and energizing LED 325.

If the status signal transmitted to pin 223, controller 290 is low, indicating AC current is passing through the AC grounding conductor 14, controller 290 will set pins 210, 212 high opening contact 706 and set pins 214, 216 low. The "00" bit pattern of pins 214, 216 of controller 290 is transmitted to pins 248, 246 of decoder 294 setting the output of pins 258–262 as a "011" bit pattern. The output of pins 258–262 of decoder 294 are inverted by inverters 312–316 energizing the green LED 318 which serves to verify the boat and dock system's integrity.

Once the integrity of the AC grounding conductor path to earth ground is verified controller 290 starts monitoring the status signal transmitted to pin 223 from inverter 604 (FIG. 5). If AC current is detected passing through the AC grounding conductor 14 by the AC ground current detecting circuit 600 for continuously more than five seconds, controller 290 will set its pin 214 low and pins 216, 220 high. The "01" bit pattern of pins 214, 216 of controller 290 is transmitted to pins 248, 246 of decoder 294 setting the output states of pins 258–262 as a "101" bit pattern. The output of pins 258–262 of decoder 294 are inverted by inverters 312–316 thereby energizing LED 320 indicating AC current in the grounding conductor 14 was detected. Setting pin 220 high biases transistor Q1 and activates alarm 17. Controller 290 will remain in this mode until the current is no longer detected by continuously checking the status signal transmitted to pin 223. Once the status signal at pin 223 indicates the current is no longer passing in the AC grounding conductor 14, controller 290 then returns to its continuous monitoring mode by setting its pins 214, 216, 220 low thereby energizing the green LED 318 and deactivating alarm 17.

While the invention has been described with reference to specific embodiments thereof, it will be appreciated that numerous variations, modifications, and embodiments are possible, and accordingly, all such variations, modifications, and embodiments are to be regarded within the spirit and scope of the invention.

For example, it is well within the scope of the present invention to detect the integrity of a boat's galvanic isolator by providing a means for applying, for example, a first test voltage referenced to boat DC ground 15 across galvanic isolator 12 biasing a first pair of diodes of the boat's galvanic isolator 12 and a means to (for example a volt-meter) evaluate the resulting voltage drop across the galvanic isolator so as to determine whether the first pair of diodes is operative, then applying a second test voltage referenced to the boat DC ground 15 and having a polarity opposite to the first test voltage across galvanic isolator 12 biasing the remaining second pair of diodes of the galvanic isolator, and evaluate the resulting voltage drop across the galvanic isolator so as to determine whether the second pair of diodes of the galvanic isolator is operational.

It is also well within the scope of the present invention to provide the circuitry of the invention in a portable device connected to a DC power source for detecting the integrity of the galvanic isolator.

It should be further noted that the specific power supply circuit, polarity detecting circuit, system control circuit, galvanic isolator integrity detecting circuit, AC ground current detecting circuit and momentary ac current inducing circuit are not to be construed as limiting on the scope of the invention. Other means such as: different types of programmable micro-controllers having more I/O pins reducing or eliminating the external control circuitry such as decoders and analog switches; analog to digital converters used in lieu of the voltage comparators and inverters in the isolator integrity detecting circuit; a manual rotary switch used to control the circuit or replace relays; or the order and number of steps involved in the system may be varied and thus the embodiment described is not to be construed as being a limitation on the invention.

The standard components employed in the preferred embodiment are identified in the listing below.

| Components | Description |
| --- | --- |
| 102 | 120/12.6V, 1A |
| 104 | 120/6.3V, 1A |
| 106, 108 | 50V, 1A F.W. Bridge Rectifier |
| 144 | 317T Adj. Voltage Reg. |
| 818 | 4N25 Optocoupler |
| 810, 550, 608, 616 | 1/2 LM358 Op-amp |
| 304–318, 526–532, 604, 811 | 1/6 74LS14 Inverter |
| 290 | Parallax BS1-IC, Programmable Micro-Controller |
| 292, 294 | 74LS155 Decoder |
| 296 | 4066 Analog Switch |
| 518–524 | 1/4 LM339 Comparator |
| Q1–Q4 | 2N2222, NPN Transistor |
| 602 | Amecon 5327, Current transformer |
| 508, 510 | 5V coil, DPDT |
| 704 | 5V coil, SPDT, contact 120V, 1A |
| 205 | NO Momentary Type |
| 17 | Piezzo Buzzer |
| 120, 146 | 16V, 1000uF Capacitors |
| 611 | 50V, 1uF |
| 609 | 1N914 Diode |
| 126, 128 | 6V, 5W, Zener Diode |
| 812 | 15K ohm, 1/4W Resistor |
| 814 | 10K ohm, 1/4W Resistor |
| 122 | 8.5 ohm, 5W Resistor |
| 124 | 50 ohm, 5W Resistor |
| 150, 808, 618 | 4.7K ohm, 1/4W Resistor |
| 148 | 14K, 1/4W Resistor |
| 802 | 10M, 1/2W Resistor |
| 804, 534 | 200 ohm, 1/4W Resistor |
| 806, 536 | 50 ohm, 1/4W Resistor |
| 302, 504, 506, 702 | 2.2K ohm, 1/4W Resistor |
| 538 | 150 ohm, 1/4W Resistor |
| 540 | 100 ohm, 1/4W Resistor |
| 552, 554, 556, 300, 324–328, 610, 614, | 1K ohm, 1/4W Resistor |
| 708 | 20K ohm, 1/4W Resistor |
| 612 | 100K ohm, 1/4W Resistor |
| 810, 322, 320, 325 | T 1-3/4, Red light emitting diode |
| 318 | T 1-3/4, Green light emitting diode |

I claim:

1. An auxiliary system for testing selected components of an on-board electrical system for a boat which electrical system is connected to a grounded AC shore power distribution system and includes as part of the boat's on-board electrical system an on-board galvanic isolator connected on one side through an AC grounding conductor to an on-shore earth ground and on an opposite side to a DC ground forming part of the boat's on-board electrical system, said galvanic isolator being made up of elements normally operative to block passage of DC currents through said galvanic isolator in both directions and to permit passage of AC currents through said galvanic isolator to said earth ground, comprising:
    (a) first circuit means electrically referenced with respect to said DC ground for applying a DC voltage of selected first polarity across said galvanic isolator and of sufficient magnitude to establish what would be expected to be a normal voltage drop corresponding thereto;
    (b) second circuit means for indicating whether the voltage drop across said galvanic isolator when said DC voltage of said first polarity and magnitude is applied thereto corresponds to that to be normally expected;
    (c) third circuit means electrically referenced with respect to said DC ground for applying a DC voltage of selected second polarity opposite said first polarity across said galvanic isolator and of sufficient magnitude to establish what would be expected to be a normal voltage drop corresponding thereto;
    (d) fourth circuit means for indicating whether the voltage drop across said galvanic isolator when said DC voltage of said second polarity and magnitude is applied thereto corresponds to that to be normally expected;
    (e) switching means adapted to operate said first, second, third and fourth circuit means; and
    (f) a DC power source operative to provide said DC voltage.

2. An auxiliary system as claimed in claim 1 wherein said second and fourth circuit means each includes a fifth circuit means for establishing a DC reference voltage window defined by upper and lower DC reference voltages and against which each respective said voltage drop established by said first and third circuit means can be compared.

3. An auxiliary system as claimed in claim 2 wherein said switching means comprises a programmable control means adapted to operate said first, second, third, fourth and fifth circuit means in a predetermined sequence.

4. An auxiliary system as claimed in claim 2 including:
    (a) sixth circuit means for determining whether said on-shore neutral and hot AC supply conductors are reversed comprising circuitry for establishing a connection between said neutral conductor and earth ground and in the event said hot and neutral conductors are reversed detecting current flowing therebetween and directing such flow of current to a signalling means responsive thereto;
    (b) seventh circuit means for detecting both the magnitude and length of time AC stray current flows in the grounding conductor connecting said galvanic isolator and earth ground and when said magnitude or time exceed some predetermined level detecting such excess magnitude or time and responsive thereto energizing a signalling means;
    (c) eighth circuit means for inducing a momentary AC current into the grounding conductor connecting said galvanic isolator and earth ground, detecting whether such induced AC current flows to said earth ground and creating a signal responsive to the absence of such flow; and (d) wherein said switching means comprising programmable means for operating said first, second, third, fourth, fifth, sixth, seventh, and eighth circuit means in some uninterrupted predetermined sequence.

5. An auxiliary system as claimed in claim 1 wherein said DC power source comprises a DC power supply powered by said AC power supply.

6. An auxiliary system as claimed in claim 1 wherein said galvanic isolator solid state elements establish a pair of parallel electrical paths through said galvanic isolator.

7. An auxiliary system as claimed in claim 1 wherein said solid state elements of said galvanic isolator establish two parallel paths each comprising a pair of diodes connected in series and oriented such that the conducting direction of one path is opposite to that of the other path, said first and third circuit means each being adapted to apply its respective said DC voltage across both said paths simultaneously.

8. An auxiliary system as claimed in claim 1 including circuit means for determining whether said on-shore neutral and hot AC supply conductors are reversed comprising circuitry for establishing a connection between said neutral conductor and earth ground and in the event said neutral and hot conductors are reversed detecting current flowing therebetween and directing such flow of current to a signalling means responsive thereto and operatively associated therewith.

9. An auxiliary system as claimed in claim 8 including an electrically energizable alarm and wherein said switching means comprises a programmable controller programmed when said auxiliary system is initially energized to respond to said sixth circuit means and in the event of said hot and neutral conductors being reversed energizing said alarm.

10. An auxiliary system as claimed in claim 1 and configured so as to periodically experience AC current flowing in said AC grounding conductor and including circuit means for detecting both the magnitude and length of time said AC current flows in the grounding conductor connecting said galvanic isolator and earth ground and when said magnitude or time exceed some predetermined level detecting such excess magnitude or time and responsive thereto energizing a signalling means operatively associated therewith.

11. An auxiliary system as claimed in claim 1 including circuit means for inducing a momentary AC current into the grounding conductor connecting said galvanic isolator and earth group at a first location on said grounding conductor, circuit means at a second location on said grounding conductor closer to said earth around than said first location for detecting whether such induced AC current flows to said earth ground and creating a signal responsive to the absence of such flow.

12. An auxiliary system as claimed in claim 1 wherein the DC voltage applied by said first circuit means is applied to the grounding conductor and is positive with respect to the boat's DC ground of said auxiliary system and the DC voltage applied by said third circuit means is applied to the grounding conductor and is negative with respect to the boat's DC ground of said auxiliary system.

13. An auxiliary system as claimed in claim 12 wherein said second and fourth circuit means each includes a fifth circuit means for establishing a reference voltage against which each respective said voltage drop established by said first and third circuit means can be compared.

14. An auxiliary system as claimed in claim 1 including means for inducing an AC current at a location connected to both said galvanic isolator and said earth ground and circuit means for detecting both the magnitude of induced AC current and length of time said induced AC current flows to said earth ground and when said magnitude or time exceed some predetermined level detecting such excess magnitude or time and responsive thereto energizing a signalling means operatively associated therewith.

15. An auxiliary system as claimed in claim 1, wherein said AC shore power distribution system is comprised of an on-shore three-wire, hot, neutral and earth ground.

16. An auxiliary system as claimed in claim 15:
(a) wherein said second and fourth circuit means each includes a fifth circuit means for establishing a reference voltage against which each respective said voltage drop established by said first and third circuit means can be compared;
(b) wherein said DC power source comprises a DC power supply powered by said AC power supply;
(c) wherein said switching means comprises a programmable control means adapted to operate said first, second, third, fourth and fifth circuit means in a predetermined sequence;
(d) wherein said solid state elements of said galvanic isolator establish two parallel paths each comprising a pair of diodes connected in series and oriented such that the conducting direction of one path is opposite to that of the other path, said first and third circuit means each being adapted to apply its respective said DC voltage across both said paths simultaneously;
(e) including sixth circuit means for determining whether said on-shore neutral and hot AC supply conductors are reversed comprising circuitry for establishing a connection between said neutral conductor and earth ground and in the event said neutral and hot conductors are reversed detecting current flowing therebetween and directing such flow of current to a signalling means responsive thereto and operatively associated therewith;
(f) including seventh circuit means for detecting both the magnitude and length of time AC stray current flows in the grounding conductor connecting said galvanic isolator and earth ground and when said magnitude or time exceed some predetermined level detecting such excess magnitude or time and responsive thereto energizing a signalling means operatively associated therewith; and
(g) including eighth circuit means for inducing a momentary AC current into the grounding conductor connecting said galvanic isolator and earth ground, detecting whether such induced AC current flows to said earth ground and creating a signal responsive to the absence of such flow.

17. An auxiliary system for testing selected components of a boat's on-board electrical system having an on-board galvanic isolator connected on one side through a grounding conductor to an on-shore earth ground and on an opposite side to a DC ground forming part of the boat's on-board electrical system, said galvanic isolator comprising solid state elements normally operative to block passage of DC currents in both directions and to permit passage of AC currents through said galvanic isolator to said earth ground, comprising:
(a) first circuit means for applying a DC voltage of selected first polarity across said galvanic isolator and of sufficient magnitude to establish what would be expected to be a normal voltage drop corresponding thereto;
(b) second circuit means for indicating whether the voltage drop across said galvanic isolator when said DC voltage of said first polarity and magnitude is applied thereto corresponds to that to be normally expected;

(c) third circuit means for applying a DC voltage of selected second polarity opposite said first polarity across said galvanic isolator and of sufficient magnitude to establish what would be expected to be a normal voltage drop corresponding thereto;

(d) fourth circuit means for indicating whether the voltage drop across said galvanic isolator when said DC voltage of said second polarity and magnitude is applied thereto corresponds to that to be normally expected;

(e) switching means adapted to operate said first, second, third and fourth circuit means; and (f) a DC power source operative to power said auxiliary system.

18. An auxiliary system as claimed in claim 17 wherein said second and fourth circuit means each includes a fifth circuit means for establishing a reference voltage against which each respective said voltage drop established by said first and third circuit means can be compared.

19. An auxiliary system as claimed in claim 18 wherein said switching means comprises a programmable control means adapted to operate said first, second, third, fourth and fifth circuit means in a predetermined sequence.

20. An auxiliary system as claimed in claim 17 wherein said galvanic isolator solid state elements establish a pair of parallel electrical paths through said galvanic isolator.

21. An auxiliary system as claimed in claim 17 wherein said solid state elements of said galvanic isolator establish two parallel paths each comprising a pair of diodes connected in series and oriented such that the conducting direction of one path is opposite to that of the other path, said first and third circuit means each being adapted to apply its respective said DC voltage across both said paths simultaneously.

22. An auxiliary system as claimed in claim 17:

(a) wherein said second and fourth circuit means each includes a fifth circuit means for establishing a reference voltage against which each respective said voltage drop established by said first and third circuit means can be compared;

(b) wherein said DC power source comprises a DC power supply powered by an on-shore AC power supply;

(c) wherein said switching means comprises a programmable control means adapted to operate said first, second, third, fourth and fifth circuit means in a predetermined sequence; and (d) said solid state elements of said galvanic isolator establish two parallel paths each comprising a pair of diodes connected in series and oriented such that the conducting direction of one path is opposite to that of the other path, said first and third circuit means each being adapted to apply its respective said DC voltage across both said paths simultaneously.

23. An auxiliary system as claimed in claim 17 wherein the DC voltage applied by said first circuit means is applied to the grounding conductor and is positive with respect to the boat's DC ground of said auxiliary system and the DC voltage applied by said third circuit means is applied to the grounding conductor and is negative with respect to the boat's DC ground of said auxiliary system.

24. An auxiliary system for testing a galvanic isolator made up of elements normally operative and arranged to block passage of DC currents in both directions and to permit passage of AC currents through said galvanic isolator to earth ground, comprising:

(a) first circuit means for applying a DC voltage of selected first polarity across said galvanic isolator and of sufficient magnitude to establish what would be expected to be a normal voltage drop corresponding thereto;

(b) second circuit means for indicating whether the voltage drop across said galvanic isolator when said DC voltage of said first polarity and magnitude is applied thereto corresponds to that to be normally expected;

(c) third circuit means for applying a DC voltage of selected second polarity opposite said first polarity across said galvanic isolator and of sufficient magnitude to establish what would be expected to be a normal voltage drop corresponding thereto;

(d) fourth circuit means for indicating whether the voltage drop across said galvanic isolator when said DC voltage of said second polarity and magnitude is applied thereto corresponds to that to be normally expected;

(e) switching means adapted to operate said first, second, third and fourth circuit means in an appropriate sequence; and (f) a DC power source operative to power said auxiliary system.

* * * * *

UNITED STATES PATENT AND TRADEMARK OFFICE
CERTIFICATE OF CORRECTION

PATENT NO. : 5,748,008
DATED      : May 5, 1998
INVENTOR(S): Keith W. Landreth

It is certified that error appears in the above-identified patent and that said Letters Patent is hereby corrected as shown below:

Column 7, line 31, "blow" should read --low--.

Column 7, line 37, "input-pins" should read --input pins--.

Column 13, line 46, "group" should read --ground--.

Column 13, line 48, "around" should read --ground--.

Signed and Sealed this

Fourteenth Day of July, 1998

Attest:

BRUCE LEHMAN

*Attesting Officer*         *Commissioner of Patents and Trademarks*